INVENTOR.
Eugene Mittelmann
By: Moore, Olson & Trexler attys

March 13, 1951
E. MITTELMANN
2,545,296
CONSTANT FREQUENCY CONTROL FOR HIGH-FREQUENCY HEATING APPARATUS
Filed Feb. 20, 1946
2 Sheets-Sheet 2

INVENTOR.
Eugene Mittelmann
By: Moore, Olson & Trexler
Attys.

UNITED STATES PATENT OFFICE 2,545,296

CONSTANT FREQUENCY CONTROL FOR HIGH-FREQUENCY HEATING APPARATUS

Eugene Mittelmann, Chicago, Ill.

Application February 20, 1946, Serial No. 649,071

4 Claims. (Cl. 250—36)

This invention relates to a constant frequency control, and more particularly to high frequency heating equipment including apparatus for maintaining constant the frequency of operation of the equipment to provide efficient transfer of energy from the oscillator to the heater and to prevent interference with radio transmission.

It is an object of my invention to provide means to maintain constant the frequency of operation of high frequency heating equipment employing an electronic oscillator.

More particularly it is an object of my invention to provide means for continuously compensating for changes in the frequency of operation of an oscillator caused by changes in the impedance of the work circuit caused or necessitated by the variation in the impedance of the reactive heater as the object or material therein is heated, so as to maintain the frequency of operation of the oscillator at a fixed or constant value.

In a high frequency heating circuit in which a heater is supplied from a power oscillator, changes in the load impedance cause changes in the frequency of operation of the oscillator unless the oscillator and the heater circuit are isolated or loosely coupled so as to minimize the reflection into the oscillator of changes of impedance in the heating circuit. A system of this sort is, however, unsatisfactory because changes in the heater impedance cause the heater circuit to be non-resonant to the frequency of operation of the oscillator and thus rapidly reduce the amount of power which can be transferred to the heater. Furthermore, changes in the heater circuit impedance may stop the operation of the oscillator.

These difficulties may be avoided and efficient power transfer may be obtained by coupling the heater to the oscillator so as not to isolate the heater circuit from the oscillator but to allow changes in the impedance of the heater circuit to affect the frequency-determining circuit of the oscillator. When, however, effective power transfer is secured by such a coupling, the resultant changes in the frequency of the oscillator are objectionable in that they make the operation of the oscillator itself less efficient and may cause interference with radio transmission or such.

The present invention avoids both the difficulties mentioned. It involves the coupling of the heater circuit to a power oscillator circuit in such manner that changes of the heater impedance change the frequency of operation of the oscillator and the utilizing of any departure of the oscillator frequency from a given value to retune one of the circuits to said given value so that the oscillator operates at a substantially constant frequency notwithstanding the reflection into its frequency-determining circuit of impedance changes in the heater.

My invention contemplates the provision of apparatus which continuously compares the frequency of operation of the oscillator to a fixed frequency standard and on change in the resultant frequency from a predetermined value, initiates operation of devices which change the reactance of the oscillator or work circuit until that resultant frequency is restored to said value, thereby maintaining the oscillator frequency at a constant value.

A further object of the invention is to provide an accurate and inexpensive means for stabilizing the frequency of a power oscillator feeding a variable impedance load.

The stabilizer which I have invented includes a frequency discriminator which produces different signals at its output when the frequency applied to it departs in different directions from the critical frequency of the discriminator. The use of signals from such a discriminator to adjust the tuner in the circuit of an oscillator provides a means for preventing the frequency of the oscillator from departing widely from the critical frequency of the discriminator. If the power-oscillator frequency is applied directly to the discriminator, the regulation of the oscillator frequency is not sufficiently close to avoid interference with radio transmission and reception unless a discriminator of elaborate and expensive construction is used.

To provide close regulation without requiring an expensive discriminator, I apply to the discriminator, not the frequency of the oscillator, but a controlling frequency which varies widely on small variations of the oscillator frequency. This control frequency is a beat frequency equal to the difference between the oscillator frequency and a fixed frequency derived from a crystal-controlled oscillator. By making the frequency of the crystal-controlled oscillator only slightly different from the frequency to be maintained in the power oscillator, I obtain a controlling beat frequency whose variation may be 100 or more times the variation in the power oscillator frequency.

The critical frequency of the frequency discriminator is made equal to the difference between the value of the frequency which it is desired to maintain in the power oscillator and the value of the frequency of the crystal-controlled oscillator. As a result, any slight departure of the frequency of the power oscillator from the desired value causes a wide departure of the controlling beat frequency from the critical frequency of the discriminator so that the corresponding signal from the discriminator may be used to retune the power oscillator to restore the controlling beat frequency to the critical value, and at the same time to restore the frequency of the oscillator to the desired value. An accurate stabilization of the frequency of the power oscillator is thus secured even though a discriminator of comparatively low sensitivity is used.

Other objects and advantages of my invention will be apparent from the following description when taken in connection with the accompanying drawings, wherein—

If a work circuit coupled to an oscillator reflects a reactive impedance change into the oscillator circuit, when the impedance of the work circuit is varied, the frequency of operation of the oscillator varies as a function of the reflected reactance. In high frequency heating equipment, wherein the work circuit consists of a reactive heater connected by a coupling reactance to the oscillator output or tank circuit, the reactive impedance reflected into the tank circuit from the work circuit may vary as one heater is substituted for another or is adjusted to accommodate different objects or materials to be heated; as the reactance of the coupler is adjusted to establish proper initial operating conditions or to maintain those operating conditions; and as the impedance of the heater varies during the heating operation.

This change in frequency may be minimized by employing a buffer or power amplifier between the oscillator and the heater, or by coupling the heater to the oscillator at coupling ratios sufficiently low or loose to isolate, so far as possible, the work circuit from the frequency determining circuit of the oscillator and thus minimize reflection of the changes in the impedance of the work circuit. These methods of minimizing change in the frequency of operation of the oscillator are not satisfactory because the changes in the impedance of the work circuit then cause the work circuit to be non-resonant at the frequency of operation of the oscillator and the amount of power which can be transferred to the heater is rapidly reduced as the natural frequency of the work circuit departs more and more from the frequency of operation of the oscillator. Under these circumstances, relatively small changes in the work circuit impedance also cause stoppage of the oscillator.

It is, therefore, more desirable to couple the reactive heater to the oscillator in such a manner that the work circuit is not isolated from the frequency determining circuit of the oscillator because, although the oscillator frequency varies, the power transferred is not reduced to as great a degree and oscillator stoppage is somewhat less likely.

When the material to be heated does not experience a loss of mass or a change in density during the heating operation, the transfer of power from a constant frequency generator may be maintained substantially constant, and oscillator stoppage avoided, by retuning and rematching the heater or work circuit to the oscillator, as disclosed in my copending application Serial Number 545,918, filed July 2, 1944.

When small change in frequency is not objectionable, because the equipment is effectively shielded, the transfer of power from a variable frequency generator may be maintained substantially constant throughout the entire heating operation by varying the coupling between the heater and the oscillator, as disclosed in my copending application Serial Number 545,917, filed July 2, 1944, now issued as Letters Patent Number 2,460,443.

Figures 1, 3, 4, 5:
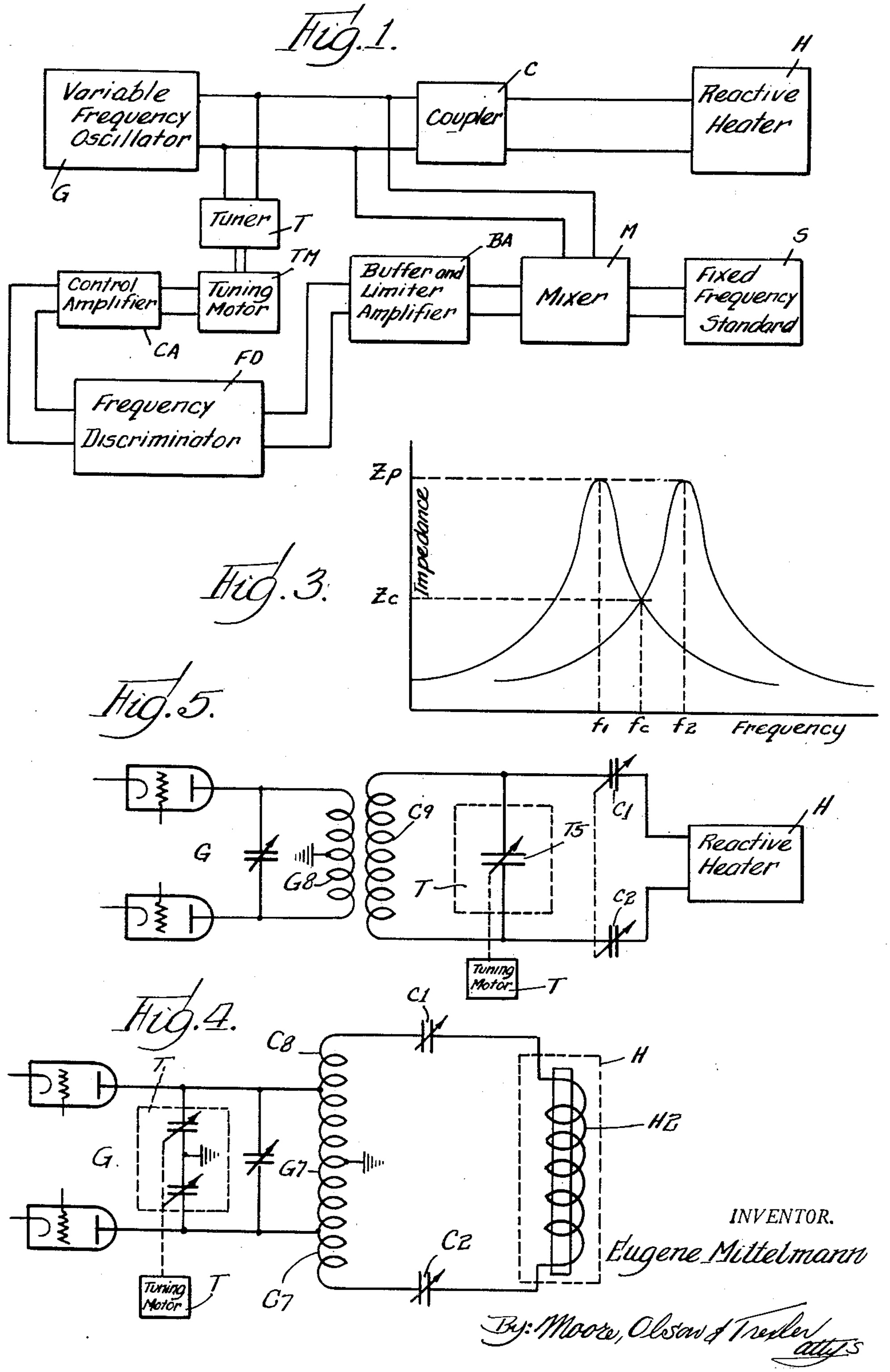
Figure 1 is a block diagram of high frequency heating apparatus embodying my invention.
Figure 3 is a frequency-impedance chart illustrating certain principles underlying the frequency discriminator which forms part of the apparatus illustrated in Figures 1 and 2.
Figure 4 is a schematic diagram illustrating a modification of the circuit of Figure 2 for energizing an induction heater.
Figure 5 is a schematic diagram illustrating a modification of the circuit of Figure 2 for retuning the work circuit to maintain the frequency of operation of the apparatus at a constant value.

Apparatus constructed in accordance with the present invention, as generally illustrated in Figure 1, prevents frequency drift as the heater or work circuit impedance is changed and prevents radio communication interference, even when the apparatus cannot be effectively shielded, by thus restricting the operation of the high frequency heating equipment to one of the particular frequencies allocated for that purpose.

It will be apparent that apparatus embodying this invention may also be usefully employed in connection with the apparatus shown in my copending application, Serial Number 545,918, to provide a generator of more exactly constant frequency and in connection with the apparatus shown in my copending application, Serial Number 545,917, to eliminate the possibility of radio communication interference where shielding is not possible or is less desirable than the maintenance of constant frequency.

Figure 1 illustrates a heating apparatus consisting of a variable frequency generator or electronic oscillator G connected to a reactive heater H through a coupler C which so reflects changes in the impedance of the reactive heater to the oscillator that the frequency of operation of the oscillator varies with the changes in impedance of the heater. A mixer M is connected across the circuit and to a fixed frequency standard S. The mixer M compares the frequency of operation of the oscillator to the fixed frequency of the standard and applies a voltage at the resultant frequency to a buffer and limiter amplifier BA. The buffer and limiter amplifier BA feeds a frequency discriminator FD which, when the resultant frequency varies from a predetermined value, applies a voltage to a control amplifier CA. The control amplifier CA is connected to and controls the operation of a tuning motor TM which drives a tuner T connected to the circuit to compensate for the change in the reactance of the circuit caused or necessitated by changes in the impedance of the heater during the heating operation. The tuning motor TM continues to drive the tuner T until the resultant frequency provided by the mixer M is restored to a predetermined value and, hence, until the oscillator frequency is restored to its initial value.

Figure 2:
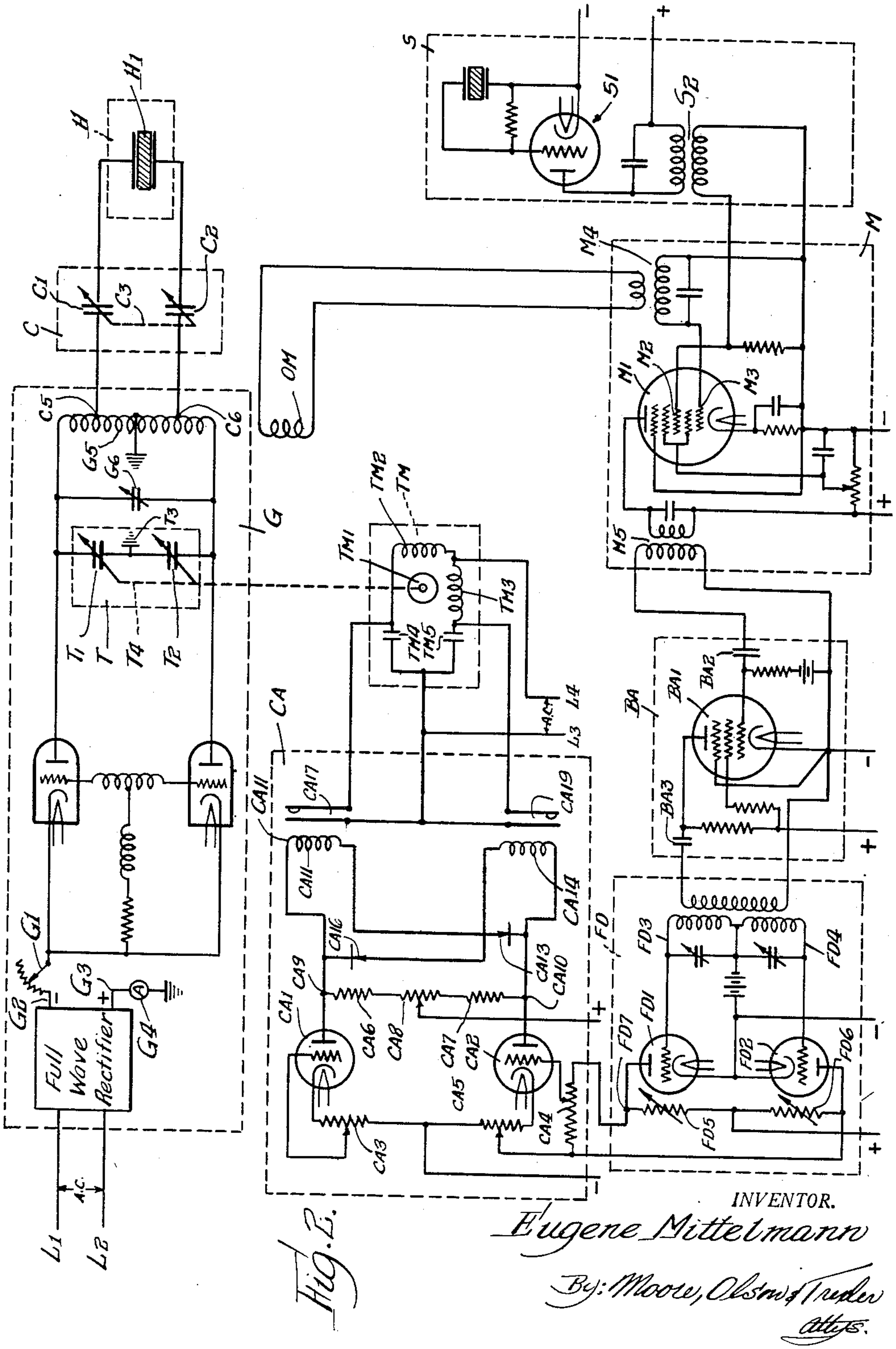
Figure 2 is a schematic diagram illustrating the circuit details of a preferred form of the apparatus illustrated in Figure 1.

As shown in Figure 2, the reactive heater H may be an electrostatic heater H1 adapted to receive the dielectric material or objects to be heated, and the coupler C comprises adjustable condensers C1 and C2 interconnected for simultaneous adjustment by the common adjusting shaft C3. The shaft C3 may be adjusted manually or automatically in accordance with or by the method or apparatus shown in my copending applications, Serial Numbers 545,917 and 545,918, above mentioned.

The oscillator G comprises a tuned-plate, tuned-grid push-pull oscillator having a power level control G1 in the form of a rheostat connected between the negative power supply lead G2 and the cathodes of the oscillator tubes. The positive power supply lead G3 is grounded through plate current meter G4. The tank coil G5 of the oscillator has its mid-tap directly grounded and its opposite ends connected to the plates of the oscillator tubes. The coupling condensers C1 and C2 are connected to intermediate coupling taps C5 and C6 on the tank coil G5. The adjustable condenser G6 is connected in shunt to the tank coil G5.

The tuner T preferably comprises a pair of variable condensers T1 and T2, or a single, "split" condenser having sections T1 and T2. The inner plates of the condensers or condenser sections are grounded, as at T3, while the outer plates of the condensers or sections are connected to the plates of the oscillator tubes and to opposite ends of the tank coil. The condensers or condenser sections are interconnected by a common adjusting shaft T4.

The condensers or condenser sections T1 and T2 are preferably of the variable spacing type consisting of a stationary plate, and a movable plate which is adjusted toward and from the stationary plate by a screw having a fine thread so that small increments of capacity change may be accurately effected by rotation of the screw.

The frequency standard S preferably comprises a crystal oscillator S1 coupled by transformer S2 to the mixer M. The mixer M preferably comprises a pentagrid mixer tube M1 connected in any well-known mixer circuit. The signal grid M2 of the mixer tube is connected to the transformer S2 of the crystal oscillator S1. The control grid M3 is connected to the secondary of an input transformer M4, the primary of which is connected to an oscillator mixer coupling coil OM inductively related to the tank coil G5 of the oscillator so as to impress on the control grid M3 a voltage of the frequency of operation of the oscillator.

The output of the mixer tube provides a voltage, the magnitude of which depends upon the magnitude of voltage picked off from the power oscillator G and the magnitude of the voltage picked off from the crystal oscillator S1, and the frequency of which is the sum or difference resultant of the frequency of the power oscillator and the fixed frequency of the crystal oscillator.

The buffer and limiter amplifier serves to isolate the frequency discriminator from the mixer and limits the magnitude of the voltage impressed on the frequency discriminator. This makes the operation of the frequency discriminator independent of variations in the magnitude of the mixer output voltage, caused, for example, by variations in the tank circuit voltage of the power oscillator G.

The buffer and limiter amplifier BA preferably comprises a pentode tube BA1 connected in any known limiter circuit such that the plate current or voltage is at the saturation value for a wide range in the magnitude of the input or grid voltage. The buffer and limiter amplifier is capacitively coupled by means of condenser BA2 to the secondary of the output transformer M5 of the mixer, and capacitively coupled through condenser BA3 to the input of the frequency discriminator FD.

The frequency discriminator comprises a pair of vacuum tubes FD1 and FD2 connected in a balance or bridge circuit. The grid-to-cathode or input circuit of the tube FD1 includes a frequency sensitive, parallel resonant circuit FD3 and the grid-to-cathode or input circuit of the tube FD2 includes a frequency sensitive, parallel resonant circuit FD4. The circuit FD3 is resonant at a frequency $f1$ (see Figure 3) and the circuit FD4 is resonant at a frequency $f2$, the resonance curves for the circuits being substantially identical in shape and intersecting at a center frequency $fc$ which differs in value from the frequency $f1$ and from the frequency $f2$ by a predetermined frequency deviation within the governmentally allowed percentage of drift. The center frequency $fc$ is the sum or difference frequency resultant from the beating of the frequency of the power oscillator with the frequency of the fixed standard. If, due to a change in the frequency of operation of the oscillator, the output frequency of the mixer approaches the frequency $f1$, then the impedance of the circuit FD3 increases in value from $Zc$ toward $Zp$, while the impedance of the circuit FD4 drops below the value $Zc$. Correspondingly, if the output frequency of the mixer varies from $fc$ toward $f2$, then the impedance of the circuit FD3 decreases and the impedance of the circuit FD4 increases.

The tubes FD1 and FD2 constitute two arms of a Wheatstone bridge circuit, the other two arms of which are formed by adjustable resistors FD5 and FD6. The resistor arms FD5 and FD6 are adjusted to balance the bridge circuit at the center frequency $fc$. By such adjustment differences in the resonance characteristic curves of the circuits FD3 and FD4 and differences in the tubes FD1 and FD2 are compensated so that when the center frequency $fc$ is impressed upon the input of the discriminator, the diagonal points FD7 and FD8 of the bridge circuit are at the same potential.

The diagonal points FD7 and FD8 of the bridge circuit are connected to the input of the control amplifier CA. The control amplifier CA comprises a direct current, or resistance type amplifier having vacuum tubes CA1 and CA2. The cathode of the tube CA1 is connected to the grid through a variable self-biasing resistor or potentiometer CA3. The grid of the tube CA2 is connected to its cathode through the input sensitivity control potentiometer CA4 and the variable self-biasing resistor or potentiometer CA5. Tubes CA1 and CA2 form two arms of a Wheatstone type bridge circuit, the other two arms of which are formed by resistors CA6, CA7 and potentiometer CA8, the wiper arm of which, on adjustment, balances the bridge circuit and causes equal potential to exist at the diagonal points CA9 and CA10 when the terminals FD7 and FD8 of the frequency discriminator are at the same potential.

A forward motor control relay CA11 is connected across the balance points CA9 and CA10 in series with a rectifier CA13, the rectifier being so poled as to preclude the flow of current through the relay CA11 when the point CA9 is at a positive potential with respect to the point CA10.

The reverse motor relay CA14 is connected across the balance points CA9 and CA10 in series with a rectifier CA16, this rectifier being so poled as to preclude the flow of current through the relay CA14 when the point CA10 is at a positive potential with respect to the point CA9. The relay CA11 operates forward motor switch CA17, while the relay CA14 operates reverse motor switch CA19.

The tuning motor TM may be a reversible motor of any well-known fractional horse power type. It is preferred, however, to employ an alternating current, single phase "drag cup" motor which possesses low inertia and fast stopping and reversing characteristics. It comprises an aluminum, or copper, cup rotor TM1, which is suitably geared or otherwise connected to the common adjusting shaft T4 of the tuner T, and forward and reverse field windings TM2 and TM3. The winding TM2 is connected in series with a capacitor TM4 to the supply lines L3 and L4, while the winding TM3 is connected in series with a capacitor TM5 to the supply lines L3 and L4.

The forward switch CA17 connects the supply line L3 to the tuning motor between the winding TM2 and the capacitor TM4, so that when the switch is closed, the capacitor TM4 is short-circuited and the motor rotates in a forward direction. The reverse switch CA19 is connected on one side to the supply line L3 and on the other side to the tuning motor between the winding TM3 and the capacitor TM5 so that when this switch is closed, the capacitor TM5 is short-circuited and the motor rotates in a reverse direction. When both of the control switches CA17 and CA19 are open, the motor stands still.

In the operation of the apparatus, the object or material to be heated is introduced into the heater. If the resonant frequency of the tank circuit of the power oscillator is varied by this introduction of the load, or by adjustment of the coupler to match the work circuit impedance to the oscillator, then the frequency of the voltage impressed on the control grid M3 of the mixer changes, and consequently the sum or difference resultant of this new frequency and the frequency of the standard source varies from the normal center frequency $fc$ toward either the frequency $f1$ or the frequency $f2$. This new, resultant frequency is fed through the buffer and limiter amplifier to the input circuit of the frequency discriminator and, hence, the voltage developed across one of the circuits FD3 and FD4 increases, while the voltage developed across the other decreases. Consequently, a voltage of one polarity or the other is developed across the balance points FD7 and FD8 of the output circuit of the frequency discriminator. The negative voltage applied to the grid of the tube CA2, by the self-biasing resistor CA5, is correspondingly increased or decreased to increase or decrease the plate current of the tube CA2. If the plate current through the tube CA2 increases, the balance point CA10 will become negative with respect to the balance point CA9, while if the plate current of the tube decreases, the point CA10 will become positive with respect to the point CA9. If the point CA10 becomes positive with respect to the point CA9, then the relay CA11 operates to close the switch CA17 and energize the tuner motor TM for forward movement to adjust the tuning condensers T1 and T2 of the tuner T in one direction and if the point CA10 becomes negative with respect to the point CA9, then the reverse switch CA19 is closed and the tuning motor TM energized for reverse movement to adjust the tuning condensers in the opposite direction. Whenever during the heating operation the impedance of the work circuit changes because of change in the impedance of the heater, or adjustment of the coupler, the oscillator frequency varies from the normal value, and hence the output voltage of the mixer varies from center frequency $fc$. The tuning motor TM will then be set in operation and cause the tuner T to compensate for the effect of the reflected impedance change on the reactance of the tank circuit and thereby restore the oscillator to the normal or constant operating frequency.

As shown in Figure 4, the reactive heater H, which may be an inductive heater H2, may be connected, when the impedance of the loaded heater exceeds the internal impedance of the oscillator, by coupling condensers C1 and C2 to the outer ends of coupler coils C7 and C8 inductively related, and connected, to the tank coil G7 of the oscillator G.

As shown in Figure 5, the reactive heater H may be coupled to the oscillator G through a two-winding transformer, the primary G8 of which constitutes the tank coil of the oscillator and the secondary C9 of which constitutes a coupler coil connected to the reactive heater through the coupling condensers C1 and C2. If the coupling coefficient between the coils G8 and C9 is of sufficiently high value so that the changes in the impedance of the work circuit are reflected in changes in the oscillator frequency, then the tuner T may comprise a tuned condenser T5 connected in shunt to the secondary or coupling coil C9 of the coupling transformer. If the impedance of the loaded reactive heater is substantial or large compared to the reactive impedance of the coupling elements, then the change in frequency caused by a change in the impedance of the heater during the heating operation may be, by the circuit of Figure 5, utilized to retune the work circuit to the same natural frequency as the oscillator, while at the same time maintaining the oscillator frequency constant.

While certain specific structural details have been disclosed and described herein for the purposes of illustration, it will be apparent that modifications and changes may be made without departing from the spirit and scope of the appended claims.

The invention is hereby claimed as follows:

1. In high frequency apparatus, a high frequency oscillator circuit, a work circuit including a reactive load so coupled to the oscillator circuit that changes in the impedance of the work circuit affect the frequency of operation of the oscillator circuit, a fixed frequency source, means coupled to the oscillator and said source for beating the oscillator frequency with a fixed frequency, a tuner in said work circuit, means including circuits tuned to different frequencies coupled to said beating means and to said tuner for operating the tuner when the difference between the frequency of the oscillator circuit and the fixed frequency varies from a predetermined value whereby to maintain constant the frequency of operation of the oscillator.

2. High frequency apparatus as set forth in claim 1 wherein the means for operating the tuner includes a discriminator and a balanced amplifier fed by said discriminator.

3. High frequency apparatus as set forth in claim 1 wherein the means for operating the tuner includes an electronic bridge and means for amplifying the unbalance of said bridge.

4. High frequency apparatus as set forth in claim 1 wherein the means for operating the tuner includes a balanced amplifier, a pair of relay coils respectively connected across the output of said balanced amplifier, a unilaterally conductive device in series with each relay coil, the unilaterally conductive devices being reversely connected relative to one another, a tuning motor, and a pair of relay switches respectively operable by said relay coils to establish an interconnection between said motor and an external power source to drive said motor forwardly or reversely.

EUGENE MITTELMANN.

REFERENCES CITED

The following references are of record in the file of this patent:

UNITED STATES PATENTS

| Number | Name | Date |
|---|---|---|
| 2,151,127 | Logan | Mar. 31, 1939 |
| 2,243,202 | Fritz | May 27, 1941 |
| 2,324,525 | Mittelmann | July 20, 1943 |
| 2,358,454 | Goldstine | Sept. 19, 1944 |
| 2,379,689 | Crosby | July 3, 1945 |
| 2,381,057 | Hutcheson | Aug. 7, 1945 |
| 2,396,004 | Gilbert | Mar. 5, 1946 |
| 2,404,852 | Koch | July 30, 1946 |
| 2,406,309 | Ziegler et al. | Aug. 20, 1946 |
| 2,410,817 | Ginzton et al. | Nov. 12, 1946 |
| 2,415,799 | Reifel et al. | Feb. 11, 1947 |
| 2,416,172 | Gregory et al. | Feb. 18, 1947 |
| 2,420,857 | Brown | May 20, 1947 |
| 2,438,595 | Zottu | Mar. 30, 1948 |
| 2,441,435 | Mittelmann | May 11, 1948 |

OTHER REFERENCES

Gilbert, "Automatic Tuning System for Preheating Plastics," Electronics, vol. 17, No. 12, Dec. 1944, pages 115–117.